(12) United States Patent
Parks

(10) Patent No.: US 6,965,538 B1
(45) Date of Patent: Nov. 15, 2005

(54) PROGRAMMING AND EVALUATING THROUGH PMOS INJECTION

(75) Inventor: Jay S. Parks, Boise, ID (US)

(73) Assignee: Micron Technology, Inc., Boise, ID (US)

(*) Notice: Subject to any disclaimer, the term of this patent is extended or adjusted under 35 U.S.C. 154(b) by 30 days.

(21) Appl. No.: 10/910,201

(22) Filed: Aug. 3, 2004

(51) Int. Cl.$^7$ ................................................. G11C 7/00
(52) U.S. Cl. ................................ 365/225.7; 365/189.09
(58) Field of Search .......................... 365/225.7, 189.09, 365/185.03, 185.17

(56) References Cited

U.S. PATENT DOCUMENTS

| | | | |
|---|---|---|---|
| 4,903,091 A | 2/1990 | Baba | |
| 4,952,788 A | 8/1990 | Berger | |
| 5,493,235 A | 2/1996 | Khayat | |
| 5,545,917 A | 8/1996 | Peppiette | |
| 5,594,687 A | 1/1997 | Lin | |
| 5,646,901 A | 7/1997 | Sharpe-Geisler | |
| 5,650,747 A | 7/1997 | Chen | |
| 5,687,118 A | 11/1997 | Chang | |
| 5,777,495 A | 7/1998 | Arques | |
| 5,834,813 A | 11/1998 | Ma | |
| 5,909,392 A | 6/1999 | Chang | |
| 6,097,635 A | 8/2000 | Chang | |
| 6,166,954 A | 12/2000 | Chern | |
| 6,545,504 B2 | 4/2003 | Sun | |
| 6,667,902 B2* | 12/2003 | Peng | 365/182 |
| 6,713,839 B2* | 3/2004 | Madurawe | 257/530 |
| 6,798,693 B2* | 9/2004 | Peng | 365/177 |
| 2002/0114188 A1 | 8/2002 | Lee | |
| 2003/0001666 A1 | 1/2003 | Watanabe | |
| 2003/0043652 A1 | 3/2003 | Yamauchi | |

FOREIGN PATENT DOCUMENTS

CA       2 442 815       10/2002

OTHER PUBLICATIONS

Mar Hershenson, et al, "Optimal Design of a CMOS Op-Amp via Geometric Programming," IEEE Transactions on Computer-Aided Design of Integrated Circuits and Systems, vol. 20, No. 1, pp. 1-21, Jan. 2001.

* cited by examiner

Primary Examiner—Vu A. Le
(74) Attorney, Agent, or Firm—Leffert Jay & Polglaze, P.A.

(57) ABSTRACT

A PMOS transistor includes a gate, drain, and source in a substrate and is isolated from adjacent transistors in the substrate by shallow trench isolation. The transistor is programmed by applying a gate voltage to the gate and generating a drain-to-source voltage across the transistor that is of sufficient magnitude such that electrons are injected into the shallow trench isolation. This degrades the transistor so that it cannot be turned off. In one embodiment, the magnitude of the source-to-drain voltage depends on the gate voltage.

27 Claims, 4 Drawing Sheets

PROGRAMMING AND EVALUATING THROUGH PMOS INJECTION

TECHNICAL FIELD OF THE INVENTION

The present invention relates generally to memory devices and in particular the present invention relates to dynamic random access memories.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), and synchronous dynamic random access memory (SDRAM).

DRAM arrays are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor. The capacitor holds the value of each cell, namely a "1" or a "0," as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell.

The DRAM device also includes additional components. These components include anti-fuses that can be used for a variety of applications including storing operation data or selectively enabling or disabling components on a DRAM circuit. For example, an anti-fuse can enable redundant rows of memory cells that are used to replace defective rows of memory cells, thereby allowing an otherwise defective memory to be utilized.

An anti-fuse is a programmable link that has been developed for use in integrated circuit applications. Instead of the programming mechanism causing an open circuit, as in the case with fusible links, the programming mechanism in an anti-fuse circuit creates a short circuit or relatively low resistance link. The anti-fuse link thus presents an open circuit prior to programming and a low resistance connection after programming. Anti-fuse links consist of two electrodes comprised of conductive and/or semiconductive materials and having some kind of a dielectric or insulating material between them. During programming, the dielectric in between the conductive materials is broken down by predetermined applied voltages, thereby electrically connecting the conducting and/or semiconducting materials together.

As the performance of electronic devices increases, the performance of the DRAM used in the system needs to increase as well. One method used to increase DRAM speed and density is to shrink the size of the memory array and other components in order to fit more on a single die.

One problem with shrinking the components of a DRAM is that the anti-fuses cannot easily be reduced in size. These components and their peripheral circuitry, such as power buses, remain relatively large and require a substantial amount of current to program. Gate oxide anti-fuses have been used to replace the standard anti-fuse but they can have problems with being reliably programmed.

For the reasons stated above, and for other reasons stated below that will become apparent to those skilled in the art upon reading and understanding the present specification, there is a need in the art for scalable anti-fuses.

SUMMARY

The above-mentioned problems with dynamic random access memories and other problems are addressed by the present invention and will be understood by reading and studying the following specification.

The present invention encompasses a method for programming a transistor. In one embodiment, the transistor is a PMOS transistor that acts as an anti-fuse in a memory device. Each transistor comprises a drain region and a source region in a substrate and is separated from other transistors in the substrate by shallow trench isolation.

The method biases the gate with a predetermined gate voltage. A drain-to-source voltage is generated across the transistor that is sufficiently large so as to inject electrons into the shallow trench isolation. In one embodiment, the drain-to-source voltage is generated in response to the predetermined gate voltage.

Further embodiments of the invention include methods and apparatus of varying scope.

DETAILED DESCRIPTION

Figure 1:
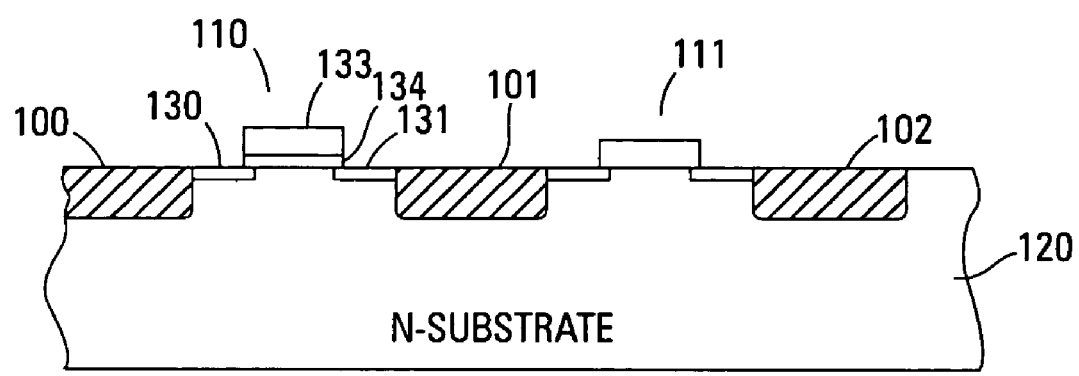
FIG. 1 shows a cross-sectional view of one embodiment of a PMOS memory array incorporating shallow trench isolation.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a cross-sectional view of one embodiment of a PMOS memory array incorporating shallow trench isolation (STI). The transistors 110 and 111 of the array are separated by the STI 100–102. As is well known in the art, the transistors, in one embodiment, are comprised of two p+ source/drain regions 130 and 131 doped into the substrate 120. The transistor additionally has a control gate 133 formed above the substrate and substantially between the two source/drain regions. The gate is isolated from the substrate by a dielectric material 134.

The STI 100–102 may be filled with an oxide material or some other isolation material. In one embodiment, there is a nitride layer between the n-type substrate 120 and the oxide material of the STI.

The embodiments of the present invention trap a charge in the STI 100–102. This degrades a transistor near that particular STI so that it cannot be turned off. The charge may be trapped in the nitride layer, if the embodiment includes such a layer, or in the oxide material or other material filling the STI.

Figure 2:
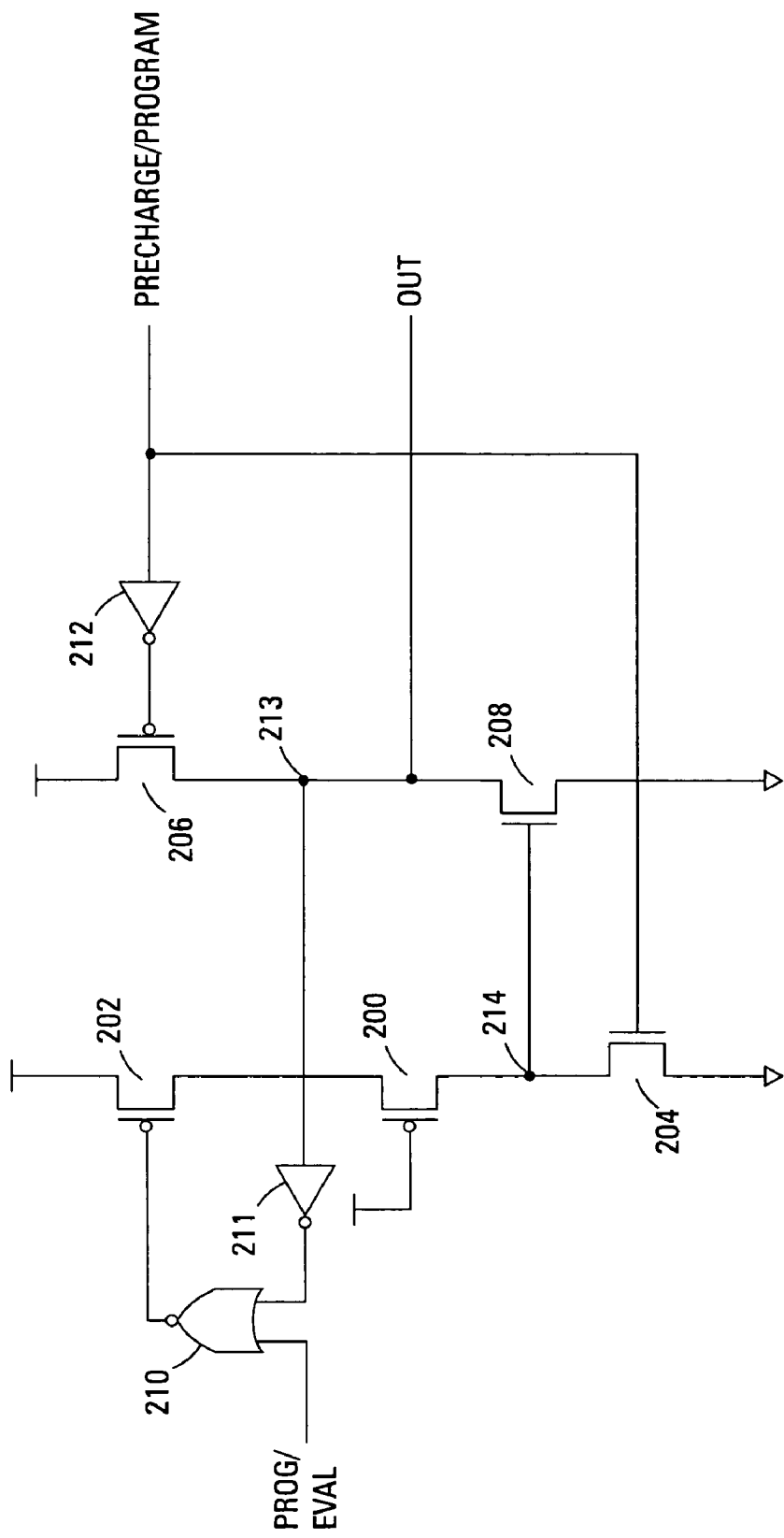
FIG. 2 shows a schematic diagram of one embodiment for a PMOS programming and evaluation circuit of the present invention.

FIG. 2 illustrates a schematic of one embodiment for a p-type, metal oxide semiconductor (PMOS) transistor programming and evaluation circuit. This circuit is for purposes of illustration only since the direct injection PMOS programming and evaluation of the present invention is not limited to any one circuit.

The PMOS transistor 200 to be programmed, in one embodiment, acts as an anti-fuse in a DRAM device. For purposes of clarity, only one anti-fuse, PMOS transistor 200 to be programmed is shown. A typical DRAM device might have tens of thousands of these devices and, therefore, tens of thousands of PMOS transistor programming and evaluation circuits.

In one embodiment, the circuit of FIG. 2 has two phases. Phase one is the programming phase. During this phase, a charge is trapped in the STI of the PMOS transistor 200 by a large $V_{DS}$ (e.g., >5V) on the transistor 200. In an alternate embodiment, the charge may be trapped in the nitride layer between the STI and the substrate. The transistor 200 is thus permanently programmed. The circuit of FIG. 2 facilitates continued degradation of the programmed PMOS while preventing degradation of an unprogrammed PMOS once the programmed state has been evaluated.

The programming is accomplished by tying high the control gate input of the PMOS transistor 200 to be programmed. In one embodiment, the control gate is tied to $V_{CC}$ (e.g., 5V). Alternate embodiments generate a gate voltage that is different than the supply voltage.

A logical high program signal is applied to the input of a NOR gate 210 whose output is coupled to a first control PMOS transistor 202. The second input of the NOR gate 210 comes from a second control PMOS transistor 206, through a first inverter gate 211, that is turned on by the program signal through a second inverter gate 212. The program signal, in one embodiment, is generated by DRAM control circuitry that is discussed subsequently with reference to FIG. 4. The drains of both the first and second control PMOS transistor are tied to $V_{CC}$.

When the second control PMOS transistor 206 is turned on, it pulls high the input node 213 to the first inverter gate 211. The logical low output from the inverter 211 and the logical high from the program signal causes the NOR gate 210 to output a logical low signal to turn on the first control PMOS transistor 202. A first NMOS transistor 204 is also turned on by the program signal thus allowing current to flow through the PMOS transistor 200 to be programmed. This creates a $V_{DS}$ across the PMOS device 200 that is large enough to inject a charge into the STI and degrade its operation. The high signal at the source node 214 turns on a second NMOS transistor 208 that pulls the output node OUT low.

The PMOS transistor 200 is now programmed and cannot be turned off. The degraded transistor 200 pulls the source node 214 high due to leakage. This turns on the second NMOS transistor 208 that causes the output node OUT to be pulled low. If the PMOS transistor 200 has not been programmed, the output node OUT will remain a logical high.

A second phase of the circuit of the present invention is the evaluation phase. This operation is used to determine if the PMOS transistor 200 has been programmed.

During the evaluation phase, a one-shot, logical high precharge pulse PRECHARGE is input to the second PMOS transistor 206 through the inverter 212. This turns on the second control PMOS transistor 206. At the same time, a logical high evaluation signal EVAL turns on the first control PMOS transistor 202. Since the NMOS transistors 204 and 208 are turned on only during the high time of the PRECHARGE pulse, the precharge operation is not long enough to degrade the device if it is not already programmed. Once the NMOS transistors 204 and 208 are turned off when PRECHARGE goes low, a smaller $V_{DS}$ remains across the PMOS device 200 than that used to degrade the transistor 200.

Once the one-shot PRECHARGE signal goes low, the EVAL signal is brought high. If the output OUT remains high, the PMOS transistor 200 is not programmed. If OUT goes low, then the PMOS transistor has been degraded sufficiently to remain permanently programmed.

Figure 3:
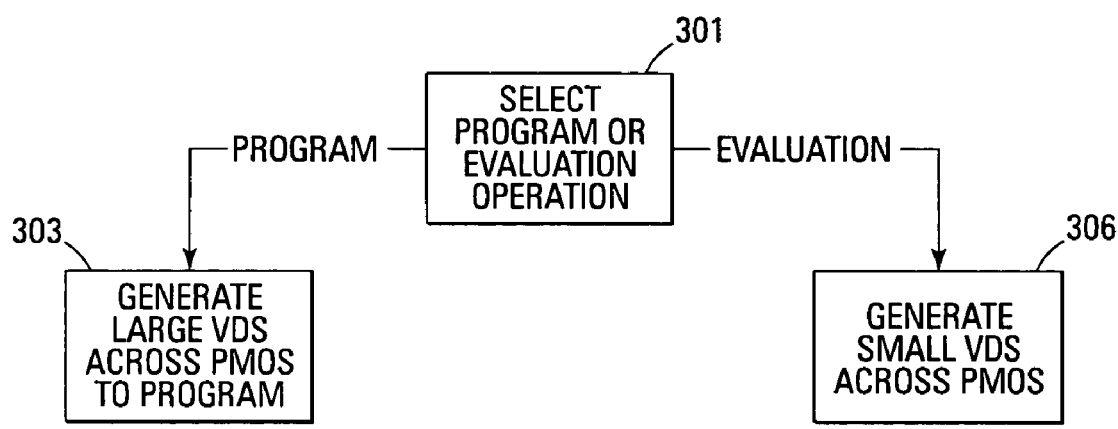
FIG. 3 shows a flowchart of one embodiment of a method for permanently programming a PMOS transistor and evaluating the programming operation.

FIG. 3 illustrates a flowchart of one embodiment of a method for permanently programming a PMOS transistor and evaluating the status of the programming operation. The method chooses between the program or evaluation operation 301.

If the programming operation is selected, a large $V_{DS}$ is created across the PMOS device in order to store a charge in the STI 303. In one embodiment, the $V_{DS}$ is approximately 5V. Alternate embodiments may use other voltages for programming. $V_{DS}$ varies with the gate voltage. For example, a gate voltage of 2.5V might need a $V_{DS}$ of 5V to trap the charge in the STI. Different gate voltages would require different drain-to-source voltages.

If the evaluation operation is selected, a $V_{DS}$ that is less than the programming voltage is generated across the PMOS device in order to evaluate whether or not it has been programmed 306. In one embodiment, the evaluation $V_{DS}$ is approximately 2.5V. Alternate embodiments may use other voltages that are different enough from the programming voltage such that the evaluation operation does not accidentally program the device.

Figure 4:
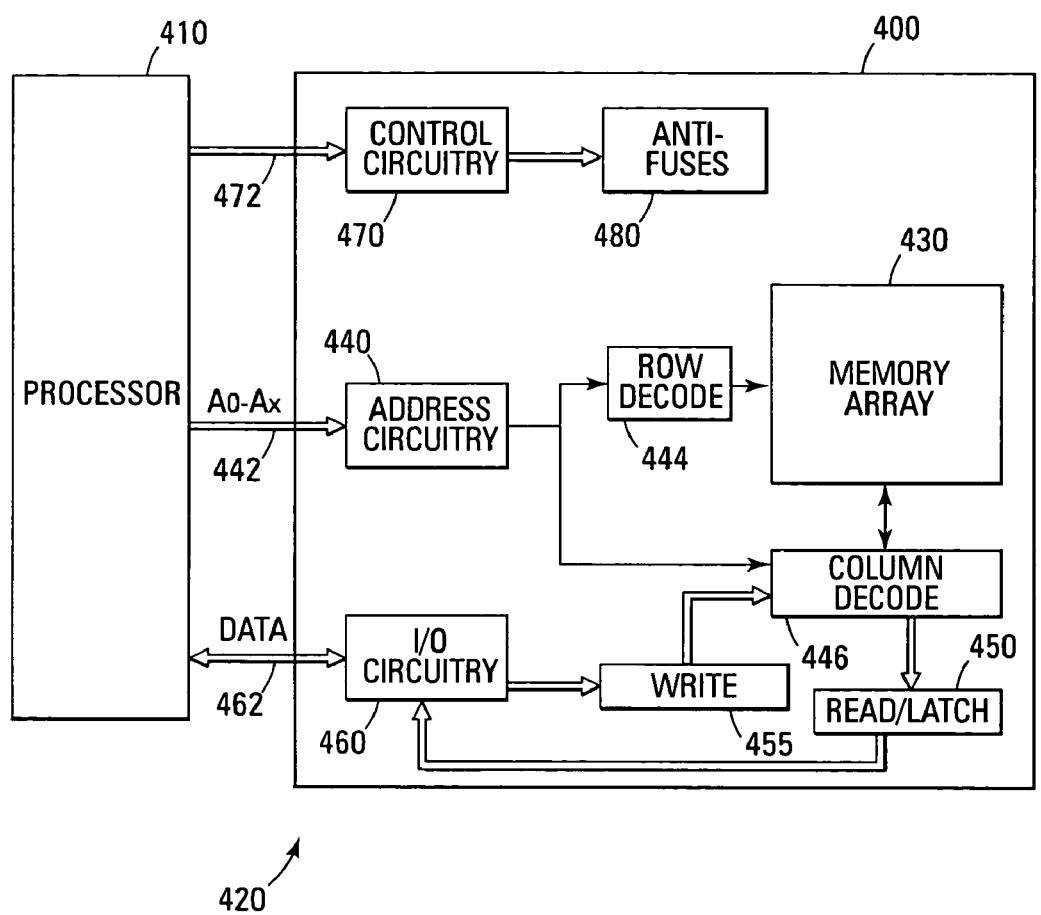
FIG. 4 shows a block diagram of one embodiment for a DRAM device incorporating the PMOS programming and evaluation circuit of the present invention.

FIG. 4 illustrates a functional block diagram of a dynamic random access memory device 400 that can incorporate the PMOS transistors of the present invention acting as anti-fuses. The memory device 400 is coupled to a processor 410. The processor 410 may be a microprocessor or some other type of controlling circuitry. The memory device 400 and the processor 410 form part of an electronic system 420. The memory device 400 has been simplified to focus on features of the memory that are helpful in understanding the present invention.

The memory device 400 includes an array of memory cells 430. The memory array 430 is arranged in banks of rows and columns. The architecture of the DRAM array 430 is well known in the art.

An address buffer circuit 440 is provided to latch address signals provided on address input connections A0–Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense/buffer circuitry 450. The sense/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including generating the program and evaluation signals of the present invention. The control circuitry is also coupled to the output signal of the circuit of FIG. 2 in order to determine the program status of the transistors. The control circuitry 470 may be a state machine, a sequencer, or some other type of controller.

The memory device illustrated in FIG. 4 has been simplified to facilitate a basic understanding of the features of the memory. A more detailed understanding of internal circuitry and functions of DRAMs are known to those skilled in the art.

CONCLUSION

In summary, the embodiments of the method and circuit of the present invention change the off current of a PMOS transistor and evaluate whether or not the transistor has been programmed. The circuit facilitates continued degradation of a programmed PMOS transistor while preventing degradation of an unprogrammed transistor. In one embodiment, the PMOS transistor is used as an anti-fuse in a DRAM device. However, the programming of the PMOS device by storing a charge in the STI can be used in other implementations besides DRAMs or as anti-fuses.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a transistor that comprises a drain region and a source region in a substrate and is separated from other transistors in the substrate by shallow trench isolation, the method comprising:
   biasing the gate at a gate voltage; and
   generating a drain-to-source voltage across the transistor that is sufficiently large so as to inject electrons into the shallow trench isolation.

2. The method of claim 1 wherein the transistor is a p-type metal oxide semiconductor (PMOS) transistor.

3. The method of claim 1 wherein the shallow trench isolation is comprised of an oxide dielectric.

4. The method of claim 3 wherein a nitride layer separates the oxide dielectric from the substrate and the injected electrons are stored in the nitride layer.

5. The method of claim 1 wherein the drain-to-source voltage is substantially equal to or greater than 5.0V.

6. A method for programming a PMOS transistor that comprises a gate, a drain region and a source region in a substrate and is separated from other transistors in the substrate by shallow trench isolation, the method comprising:
   biasing the gate at a gate voltage; and
   generating a drain-to-source voltage across the transistor in response to the gate voltage, the drain-to-source voltage sufficiently large so as to inject electrons into the shallow trench isolation.

7. The method of claim 6 wherein the drain-to-source voltage is double the gate voltage.

8. The method of claim 6 wherein the gate voltage is a fixed voltage.

9. The method of claim 6 wherein the shallow trench isolation is filled with an oxide material in which the oxide stores a charge.

10. A transistor that acts as an anti-fuse in a memory device, the transistor comprising:
    a substrate having first and second source/drain regions;
    a gate formed above the substrate substantially between the first and second source/drain regions, the gate coupled to a fixed gate voltage; and
    a shallow trench isolation formed in the substrate that separates the transistor from other transistors in the substrate, wherein the shallow trench isolation stores a charge in response to a voltage generated across the first and second source/drain regions.

11. The transistor of claim 10 wherein the transistor is a PMOS device.

12. The transistor of claim 10 wherein the memory device is a dynamic random access memory device.

13. The transistor of claim 10 and further including a nitride layer lining the shallow trench isolation for acting as a charge storage region.

14. The transistor of claim 10 wherein the shallow trench isolation is filled with an oxide material that acts as a charge storage region.

15. A PMOS transistor programming circuit, the PMOS transistor comprising a gate, a drain, a source, and a shallow trench isolation to isolate the transistor from adjacent transistors, the circuit comprising:
    a first control transistor coupled between a supply voltage and the PMOS transistor;
    a first NMOS transistor coupled between the PMOS transistor and ground;
    a second control transistor coupled the supply voltage and an output node;
    a second NMOS transistor coupled between the output node and ground; and
    control logic coupled to enable the first and second control transistors and the first and second NMOS transistors in response to a program signal and a voltage level of the output node such that a drain-to-source voltage is generated across the PMOS transistor that is of sufficient magnitude so as to inject electrons into the shallow trench isolation.

16. The circuit of claim 15 wherein the gate is coupled to a fixed gate voltage.

17. The circuit of claim 16 wherein the magnitude of the drain-to-source voltage is in response to the gate voltage.

18. The circuit of claim 15 wherein the first and second control transistors are PMOS transistors.

19. An electronic system comprising:
    a processor for generating memory control signals; and
    a dynamic random access memory device coupled to the processor, the device storing data in response to the memory control signals and comprising anti-fuses for storing operational data, each anti-fuse comprising:
a substrate having first and second source/drain regions;
a gate formed above the substrate substantially between the first and second source/drain regions, the gate coupled to a fixed gate voltage; and
a shallow trench isolation formed in the substrate that separates the transistor from other transistors in the substrate, wherein the shallow trench isolation stores a charge in response to a voltage generated across the first and second source/drain regions.

20. An electronic system comprising:
a processor for generating memory control signals; and
a dynamic random access memory device coupled to the processor, the device storing data in response to the memory control signals and comprising anti-fuses for storing operational data, each anti-fuse comprising a gate, a drain, and a source, the device further comprising control circuitry that is adapted to program the anti-fuses by generating a drain-to-source voltage across the transistor that is sufficiently large so as to inject electrons into the shallow trench isolation.

21. The system of claim 20 wherein the control circuitry is a state machine.

22. A dynamic random access memory (DRAM) device comprising:
a memory array for storing data;
a PMOS transistor programming circuit, the PMOS transistor comprising a gate, a drain, a source, and a shallow trench isolation to isolate the transistor from adjacent transistors, the circuit comprising:
a first control transistor coupled between a supply voltage and the PMOS transistor;
a first NMOS transistor coupled between the PMOS transistor and ground;
a second control transistor coupled the supply voltage and an output node;
a second NMOS transistor coupled between the output node and ground; and
control logic coupled to enable the first and second control transistors and the first and second NMOS transistors in response to a program signal and an output logic level of the output node such that a drain-to-source voltage is generated across the PMOS transistor that is of sufficient magnitude so as to inject electrons into the shallow trench isolation; and
control circuitry coupled to the output node and the control logic for generating the program signal and an evaluation signal for evaluating a programmed state of the PMOS transistor.

23. The device of claim 22 wherein the control logic comprises a logical NOR gate with a first input coupled to the program signal and a second input coupled to an inverted output logic level.

24. The device of claim 22 wherein the control circuitry is further adapted to generate a precharge signal, coupled to the control logic, for reading the programmed state.

25. The device of claim 24 wherein the precharge signal is a logically high one-shot pulse.

26. A dynamic random access memory device comprising:
a memory array for storing data;
a plurality of anti-fuses for storing operational data, each anti-fuse comprising a gate, a drain, a source, and shallow trench isolation for isolating adjacent anti-fuses; and
control circuitry that is adapted to program the anti-fuses by generating a drain-to-source voltage across the transistor that is sufficiently large so as to inject electrons into the shallow trench isolation.

27. The device of claim 26 wherein each anti-fuse is a PMOS transistor.

* * * * *